(12) United States Patent
Huang et al.

(10) Patent No.: US 7,933,361 B2
(45) Date of Patent: Apr. 26, 2011

(54) HYBRID DC-OFFSET REDUCTION METHOD AND SYSTEM FOR DIRECT CONVERSION RECEIVER

(75) Inventors: Kuang-Hu Huang, Hsin-Chu (TW); Wei-Chung Peng, Rancho Palos Verdes, CA (US); Chia-So Chuan, Hsin-Chu (TW)

(73) Assignee: Integrated System Solution Corp., Hsinchu (TW)

( * ) Notice: Subject to any disclaimer, the term of this patent is extended or adjusted under 35 U.S.C. 154(b) by 917 days.

(21) Appl. No.: 11/399,127

(22) Filed: Apr. 5, 2006

(65) Prior Publication Data

US 2007/0237264 A1    Oct. 11, 2007

(51) Int. Cl.
*H03K 9/00* (2006.01)
*H04L 27/00* (2006.01)

(52) U.S. Cl. ........ 375/316; 375/317; 375/319; 375/345; 375/346; 330/129; 455/234.1; 455/253.2; 455/234.2; 455/324; 455/232.1; 341/118

(58) Field of Classification Search ................ 375/316, 375/345
See application file for complete search history.

(56) References Cited

U.S. PATENT DOCUMENTS

| | | | | |
|---|---|---|---|---|
| 5,241,702 | A | 8/1993 | Dent | 455/278.1 |
| 5,422,889 | A * | 6/1995 | Sevenhans et al. | 370/442 |
| 6,313,769 | B1 | 11/2001 | Mangahas et al. | 341/118 |
| 6,516,184 | B1 * | 2/2003 | Damgaard et al. | 455/86 |
| 6,560,448 | B1 * | 5/2003 | Baldwin et al. | 455/234.1 |
| 6,728,224 | B1 * | 4/2004 | Kakizaki et al. | 370/313 |
| 6,748,200 | B1 * | 6/2004 | Webster et al. | 455/234.1 |
| 6,771,720 | B1 * | 8/2004 | Yang et al. | 375/345 |
| 6,781,424 | B2 * | 8/2004 | Lee et al. | 327/113 |
| 7,095,997 | B2 * | 8/2006 | Conti | 455/317 |
| 7,260,373 | B2 * | 8/2007 | Akamine et al. | 455/234.1 |
| 2001/0011923 | A1 | 8/2001 | Bakker et al. | 330/9 |
| 2002/0037706 | A1 * | 3/2002 | Ichihara | 455/324 |
| 2002/0042256 | A1 | 4/2002 | Baldwin et al. | 455/232.1 |
| 2002/0075892 | A1 | 6/2002 | Bezooijen et al. | 370/442 |
| 2002/0122265 | A1 | 9/2002 | Chambers et al. | 360/67 |
| 2002/0151289 | A1 | 10/2002 | Rahman et al. | 455/232.1 |
| 2003/0109241 | A1 * | 6/2003 | Kim | 455/324 |
| 2003/0174079 | A1 * | 9/2003 | Soltanian et al. | 341/118 |
| 2005/0143028 | A1 * | 6/2005 | Zheng et al. | 455/127.1 |
| 2005/0275466 | A1 * | 12/2005 | Dasgupta et al. | 330/308 |
| 2006/0068749 | A1 * | 3/2006 | Ismail et al. | 455/339 |

(Continued)

OTHER PUBLICATIONS

Jan Sevenhans et al., "The Silicon Radio Decade" IEEE Transactions on Microwave Theory and Techniques, vol. 50, No. 1, Jan. 2002, pp. 235-244.

(Continued)

*Primary Examiner* — Shuwang Liu
*Assistant Examiner* — Gina McKie
(74) *Attorney, Agent, or Firm* — J.C. Patents

(57) ABSTRACT

A hybrid structure circuit for the cancellation of both Type-I and Type-II DC offsets. It comprises a static compensator in conjunction with a servo-loop feedback amplifier to suppress the undesired DC components present along the path of the base band after the direct conversion mixer. Two mixers are used to down convert a received RF signal directly to a base band signal with two components: in-phase and quadrature-phase. Both in-phase and quadrature-phase branches employ the same circuitry for DC offset cancellation. Miller effect is also utilized in the structure in order to implement the circuit on-chip.

13 Claims, 11 Drawing Sheets

U.S. PATENT DOCUMENTS

2006/0073803 A1* 4/2006 Igarashi et al. .............. 455/296
2006/0246862 A1* 11/2006 Agarwal et al. .............. 455/260
2009/0135970 A1* 5/2009 Miyagi et al. ................. 375/345

OTHER PUBLICATIONS

Oleg V. Popov, "Dynamic DC offset impact on the 802.11a receiver performance" Circuits and Systems for Communications, 2002. Proceedings. ICCSC '02. 1$^{st}$ IEEE International Conference, pp. 250-253.

Asad A. Abidi, "Direct-Conversion Radio Transceivers for Digital Communications" IEEE Journal of Solid-State Circuits, vol. 30, No. 12, Dec. 1995, pp. 1399-1410.

Behzad Razavi, "Design Considerations for Direct-Conversion Receivers" IEEE Transactions on Circuits and Systems-II: Analog and Digital Signal Processing, vol. 44, No. 6, Jun. 1997, pp. 428-435.

Bengt Lindoff, "BER Performance Analysis of a Direct Conversion Receiver" IEEE Transactions on Communications, vol. 50, No. 5, May 2002, pp. 856-865.

Dr. Seiichi Sampei et al., "Adaptive DC-Offset Compensation Algorithm for Burst Mode Operated Direct Conversion Receivers" Vehicular Technology Conference, 1992 IEEE 42$^{nd}$, May 10-13, 1992, pp. 93-96.

James K. Cavers et al., "Adaptive Compensation for Imbalance and Offset Losses in Direct conversion Transceivers" IEEE Transactions on Vehicular Technology, vol. 42, No. 4, Nov. 1993, pp. 581-588.

Peter M. Stroet et al., "A Zero-IF Single-Chip Transceiver for up to 22Mb/s QPSK 802-11b Wireless LAN" 2001 IEEE International Solid-State Circuits Conference, Feb. 6, 2001, Session 13.

Chao-Shiun Wang et al., "A CMOS Low-IF Programmable Gain Amplifier with Speed-Enhanced DC Offset Cancellation" ASIC, 2002. Proceedings. 2002 IEEE Asia-Pacific Conference, pp. 133-136.

* cited by examiner

HYBRID DC-OFFSET REDUCTION METHOD AND SYSTEM FOR DIRECT CONVERSION RECEIVER

BACKGROUND OF THE INVENTION

Field of Invention

The present invention relates to electronic radio receiver circuits in general, and more particularly to a direct current (DC) offset reduction and automatic gain control (AGC) design for a receiver using direct conversion architecture. A Direct Conversion Receiver (DCR) is also known as a Zero Intermediate Frequency (ZIF) receiver because a DCR down-converts its radio-frequency (RF) input to baseband without involving any extra signal processing at intermediate frequency (IF) stage(s).

A DCR has recently drawn increasing interest for use in portable devices. Compared to other receiver architectures using a super-heterodyne or low-IF topology, a DCR down-converts a radio signal directly to baseband. Therefore, circuit blocks such as IF local oscillator (LO), SAW filter, and/or image-rejection mixer required for a conventional super-heterodyne or low-IF receiver are no longer needed in a DCR. With less circuit components, a DCR becomes advantageous in cost, sizes, and power consumption. Accordingly, it is possible for a DCR to be integrated into a single chip with few external components.

However, a DCR suffers from some unique problems to which a super-heterodyne and a low-IF receivers are immune. Among these problems, DC offset is arguably the most serious. Due to the fact that LO frequency is the center of the RF signal, it is not trivial to remove the unwanted DC component in a DCR without filtering out part of the signal which is very close to the RF carrier. In a real DCR implementation, the undesired DC component can be many orders of magnitude greater than its wanted alternate current (AC) signal. For instance, a down-converted signal of a few hundred microvolts ($\mu$V) may be corrupted by a DC offset at tens of millivolts (mV) level. If not properly mitigated at the analog circuit stage of a DCR, such a strong DC offset can cause the backend and digital stages of a DCR to mal-function. This is because a typical AGC circuit in a wireless local area network (WLAN) receiver can be insensitive to the weak signal since the strong DC component is present. The DC offset dominates the total signal strength that AGC senses. Therefore, without being provided sufficient gain along the receiver path, the weak corrupted signal can become too small to overcome the Analog to Digital Converter (ADC) quantization noise after it is digitized.

The undesired DC components can come from a variety of sources. Table 1 summarizes the characteristics of DC offsets for a typical WLAN environment. In this table, DC offsets are categorized into two classes: Type-I and Type-II. Type-I is dominant in magnitude but static. Type-II is less in magnitude but can be time-varying. Typical DC offset values, when referred to the output of a down-conversion mixer, are also shown in this table.

TABLE 1

Summary of DC offsets for IEEE 802.11 environment.

| Types | I | II |
| --- | --- | --- |
| Dynamics | Static-Slow | Medium-Fast |
| Order of Magnitude | 50-100 mV | 5-10 mV |

TABLE 1-continued

Summary of DC offsets for IEEE 802.11 environment.

| Types | I | II |
| --- | --- | --- |
| Sources | 1. LO self-mixing | 1. Interferer self-mixing |
|  | 2. Down-conversion mixer mismatch | 2. Variable gain amplifier mismatch |
|  | 3. Variable gain amplifier mismatch |  |
|  | 4. Supply voltage variation |  |
|  | 5. Temperature drift |  |
|  | 6. Carrier frequency change |  |

The Type-I DC offset varies slowly with time and can be considered essentially static. Type-I DC offset is mainly caused by LO self-mixing, component mismatch (e.g. mixer, filter, and amplifier) in the signal path, supply voltage variation, temperature drift, and carrier frequency change. Although this kind of DC offset component remains essentially constant during the short period of a WLAN burst packet (up to a few milliseconds), the total offset present at the down-converter mixer output could be as high as 50-100 mV.

By contrast, Type-II DC offset can vary much faster with time. Type-II DC offset is resulted from two dominant mechanisms: self-mixing of strong adjacent-channel interferer and variable gain amplifier mismatch. It is interesting to note that the term of "Variable Gain Amplifier (VGA) mismatch" shows up at Type-II as well as Type-I. This is because that the DC offset of a VGA is a function of its gain. While receiving a WLAN packet, the AGC circuit of a WLAN receiver will instantly adjust the gains of a set of VGA to maintain a constant signal level at the output of the AGC circuits, which usually connects to the input of an ADC. The dynamic gain adjustment therefore causes the DC offset to vary as a result. The conventional approach to alleviating the impact of interferer self-mixing involves a higher second-order intercept point (IP2) design, but this approach becomes useless against the offset incurred by the dynamic gain adjustment. Although the dynamic DC offsets in general has a magnitude of one order smaller than its static Type-I counterpart, Type-II DC offsets can be more difficult to mitigate due to the time-varying nature.

AC coupling is probably the best known solution to remove DC offset. As shown in FIG. 1, a floating capacitor is inserted into the down-converted signal path. The capacitor associated with resistive impedance serves as a high-pass filter to block the unwanted DC components. This simple solution works well when the received signal spectrum has a null around DC. However, this approach is not trivial as applied to WLNA reception because an 802.11b packet has its power spectrum peaked near DC. The signal becomes susceptible to distortion as long as it is filtered by a high pass filter without very low corner frequency designed. As corner frequency is getting lowered, two of practical issues must be taken into account. First, the filtering demands large capacitors and resistors in implementation; second, due to the increased time constant, it takes a longer time to suppress the DC component. However, a WLAN packet has limited preamble length for a receiver to acquire a packet, so a simple AC coupling scheme for a WLAN DCR receiver will not have sufficient time to perform DC offset cancellation. To accommodate low corner frequency with fast DC offset cancellation, more circuitry was proposed to accelerate the initial DC settling.

In FIG. 1 an auxiliary feedback path is designed. The feedback path is switched on to reduce impedance while the magnitude of DC offset is greater than a predetermined one.

With the application of this prior art, the speed to charge the blocking capacitor is enhanced and an immediate DC correction signal is provided.

In FIG. 2, another DC offset compensation scheme using additional digital circuitry was proposed. This scheme assumes that DC offset is static and any remaining DC signals present further down in the signal path (e.g. at the input to the ADC) were assumed to be unwanted DC offset signals that must be compensated for. During a calibration run after a device is powered up, DC components related to different receive path conditions, like variant VGA gain settings, etc., are individually measured. The corresponding DC offset correction values are then stored in a group of digital registers, $DC\_REG_1$, and $DC\_REG_Q$. During a real signal burst, the memorized DC offset corrections are adopted according to instant receiving path condition. After converted to analog counterpart by a Digital to Analog Converter (DAC), this analog correction signal is then added to the output of the mixer for DC offset cancellation. The remaining offset is primarily determined by the resolution of the DAC. For practical designs, the DAC usually requires around 12-15 bit resolution.

FIG. 3A shows an alternative approach using a multi-band filter structure. The short acquisition time can be achieved by using multiple filters with different bandwidth at different stages. In the first stage, a filter with the largest bandwidth is used for a short amount of time. Then, a filter with the second largest bandwidth is used for a short amount of time. To provide decent performance, three or four stages are required in this kind of design.

Chopper technique is another approach to provide DC blocking. Referring to FIG. 3B, a pair of input and output choppers were used to mitigate the DC offset generated by the amplifier. The input chopper down-converts the signal back. In the meantime, the DC offset generated by the amplifier goes through the same down-shift in its frequency. This down-shifted DC offset can then be easily filtered out by a filter. This approach has fast response against a sudden DC transition induced by the amplifier. However, this approach is susceptible to the charge injection of the input and output chopping switches. In addition, each chopper essentially serves as a mixer and two choppers are needed for each amplifier.

Furthermore, digital algorithms for fast DC offset reduction are presented, which disclose an approach where the offset is measured and compensated in digital domain entirely. However, to address the DC offset problem after an ADC quantizes the signal, a wide dynamic range ADC with a much higher resolution is required. To implement an ADC with higher resolution requires a larger chip size and greater power consumption. Therefore, a complete DC offset reduction after the ADC is not preferred for portable applications.

SUMMARY OF THE INVENTION

Accordingly, it is an object of the present invention to provide DC offset reduction method and apparatus that includes a low-resolution static compensation and an amplifier with servo-feedback loops to track the dynamic DC offset.

It is another objective of the present invention to provide a short calibration period. The process of calibration only requires two registers for different amplifier gain settings.

The present invention also provides a simple control of the DC offset reduction function. No complicated stop-and-go control logic is involved between AGC and DC reduction function in the present invention.

In addition, the proposed gain mapping approach condenses the input referred DC offset to a much smaller range. And the inclusion of the Miller approach allows for the on-chip implementation of the present invention to be possible.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve the principles of the invention. In the drawings.

DESCRIPTION OF THE PREFERRED EMBODIMENTS

Figure 1:
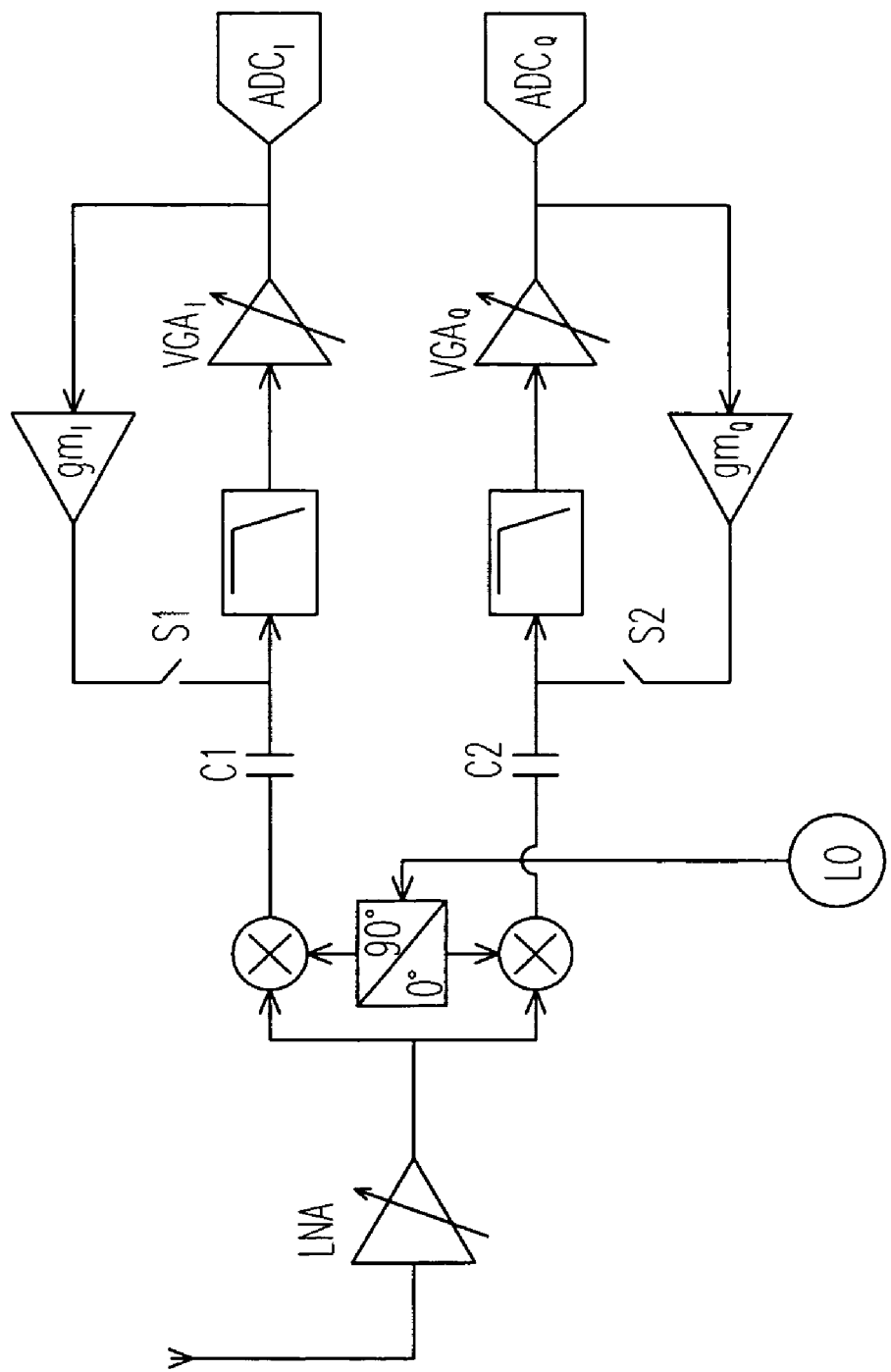
FIG. 1 is a schematic diagram depicting a conventional DC offset solution.
Figure 2:
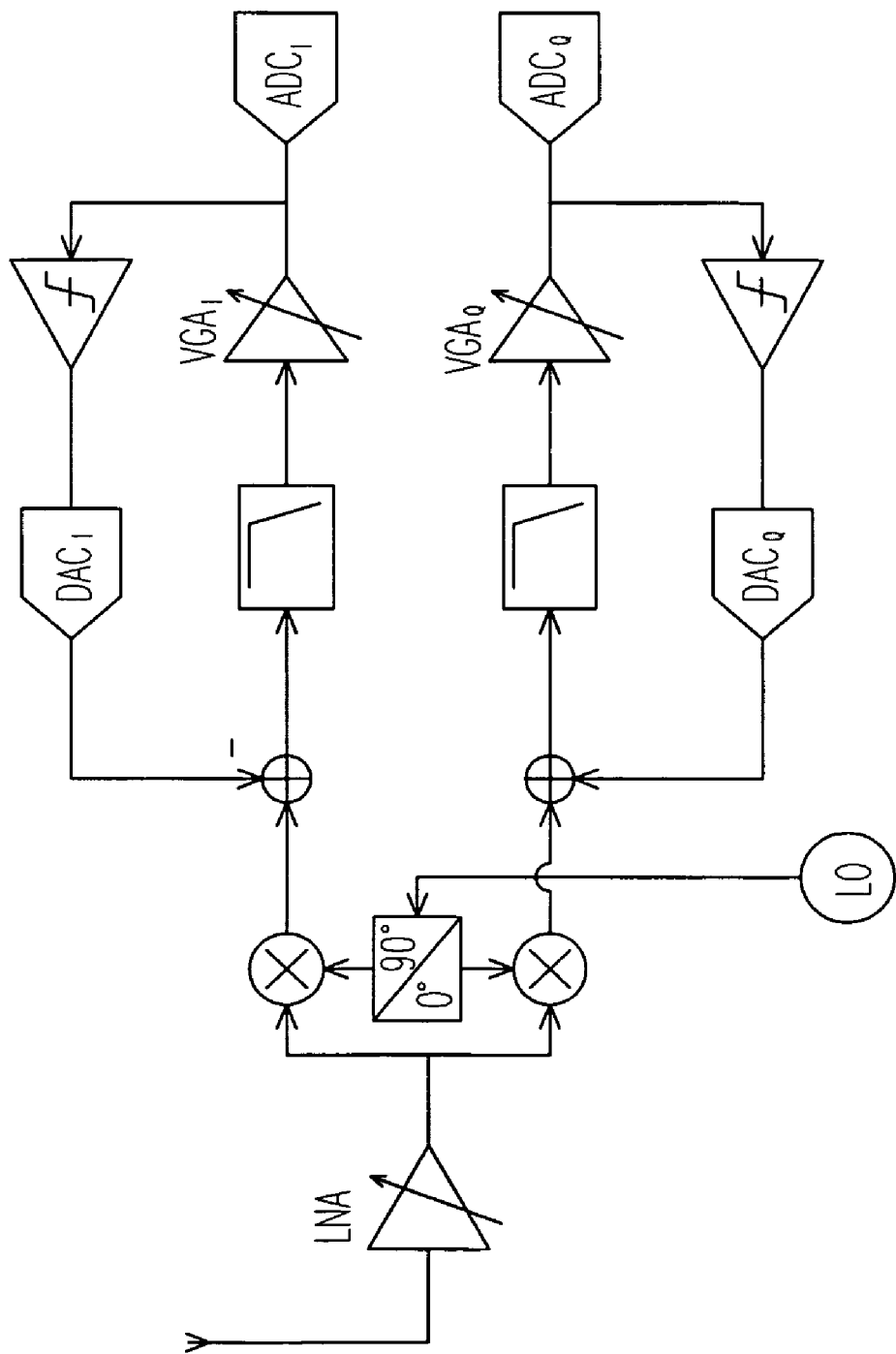
FIG. 2 is a schematic diagram depicting another conventional DC offset solution.
Figures 3A, 3B:
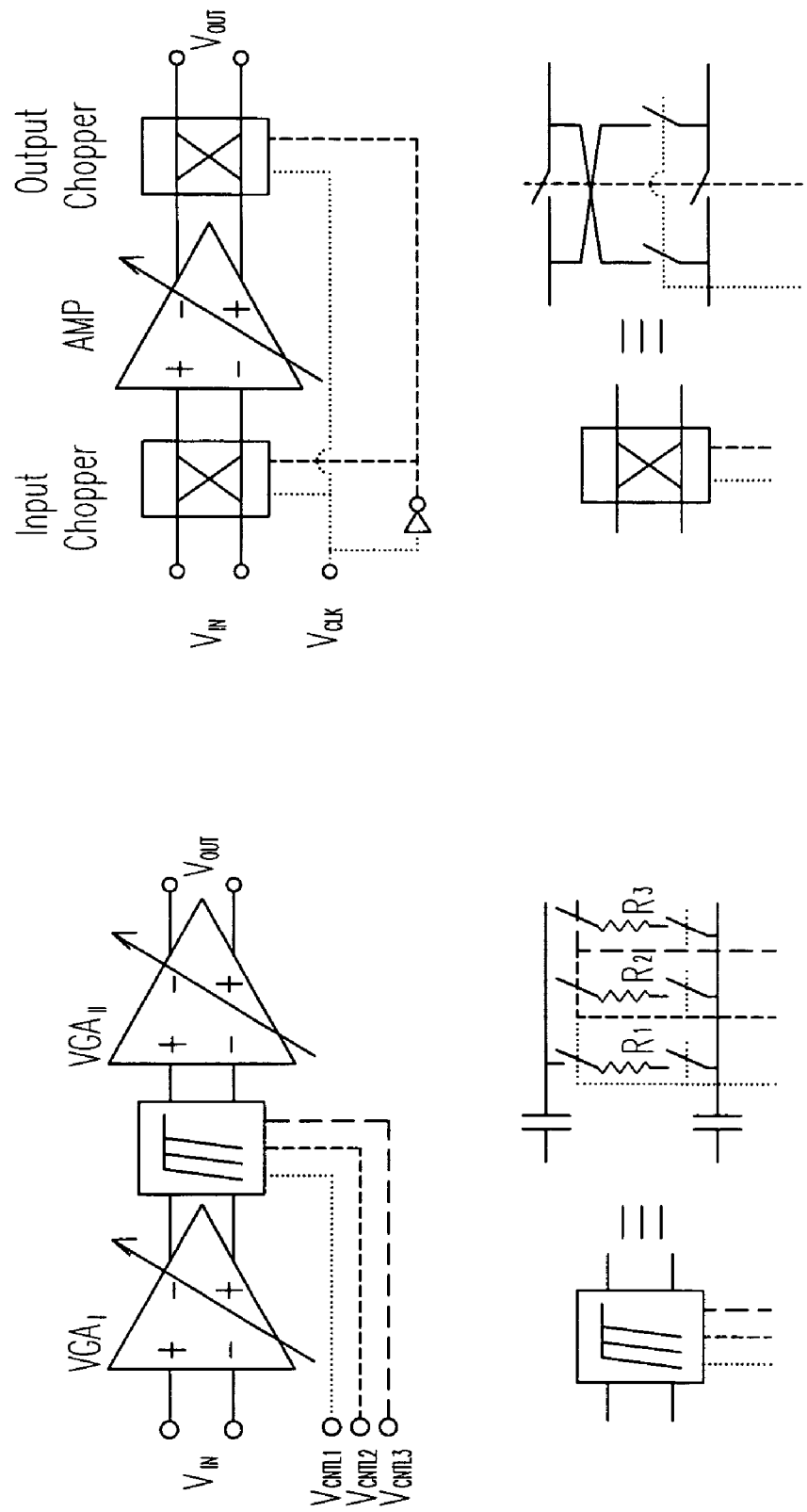
FIGS. 3A and 3B are schematic diagrams depicting another conventional DC offset solution.

Reference will now be made in detail of the present preferred embodiments of the invention, examples of which are illustrated in the accompanying drawings. Wherever possible, the same reference numbers are used in the drawings and the description to refer to the same or like parts.

Figure 4:
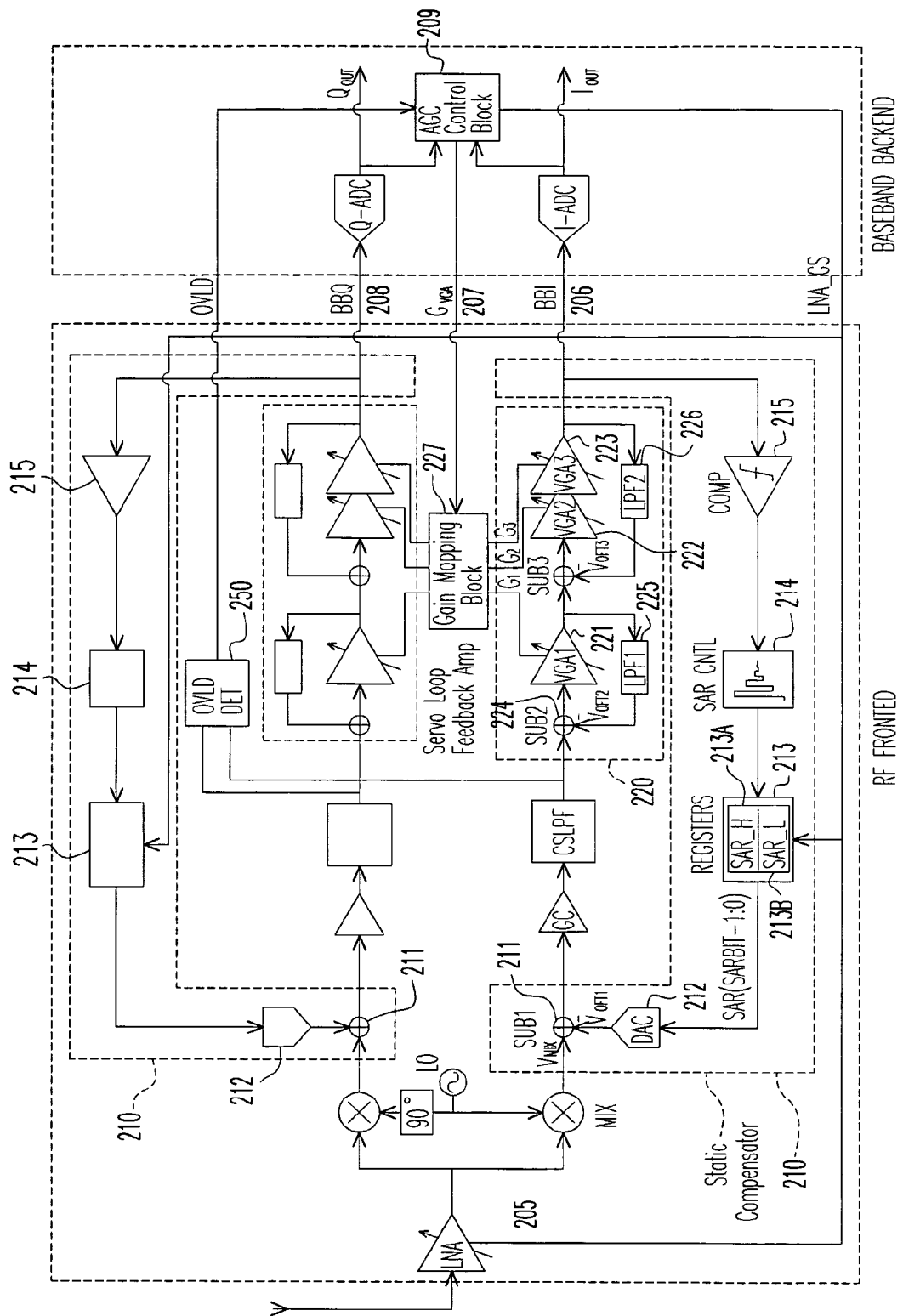
FIG. 4 is a schematic diagram depicting a DCR with DC offset circuitry according to the present invention.

Referring to FIG. 4, a DCR with a DC offset reduction circuitry according to an embodiment of the present invention is illustrated.

The circuit is configured with a hybrid structure in order to cancel both Type-I and Type-II DC offsets. It comprises a static compensator 210 in conjunction with a servo-loop feedback amplifier 220 to suppress the undesired DC components present along the path of the base band after the direct conversion mixer. Two mixers are used to down convert a received RF signal directly to a base band signal with two components: in-phase and quadrature-phase. Both in-phase and quadrature-phase branches employ the same circuitry for DC offset cancellation. For simplicity, only the in-phase part will be discussed in the following. The operation of the quadrature-phase branch is exactly the same as that of the in-phase branch.

An 802.11b packet is typically shorter than about 20 ms in length. The Type-I DC offset components during such a short period remains essentially unchanged. To cancel the Type-I DC offsets listed in Table 1, a static compensator 210 is used to provide a constant offset correction at the mixer output while receiving a packet. The static compensator 210 is composed of a subtractor SUB1 211, a digital-to-analog converter DAC 212, a pair of registers SAR_H/SAR_L 213, a SAR controller SAR_CNTL 214, and a polarity check comparator COMP 215.

Furthermore, the static compensator 210 operates under two phases: the compensation phase and the calibration phase. The compensation phase takes place when a receiver is in its normal receiving state. In this state, a receiver is ready to receive any packet transmitted over a wireless channel. During this phase, the compensator DAC 212 will provide a fixed analog signal $V_{OFT1}$ to the subtractor SUB1 211. The other input coupled into the subtractor 211 is the output of the direct conversion mixer $V_{MIX}$. With Type-I DC offset the output of the direct conversion mixer $V_{MIX}$ can be modeled as the sum of the desired signal and the Type-I DC offset. The analog signal provided by the compensator, $V_{OFT1}$, represents an estimated Type-I DC offset. At the subtractor SUB1 211, $V_{OFT1}$ is subtracted from $V_{MIX}$ to eliminate all the undesired static-type DC offsets, when referred to the mixer output. This analog compensation is based on the digital value stored in the registers of SAR_H or SAR_L 213. When the gain of the LNA 205 is switched high, the value stored in SAR_H 213A is chosen. Otherwise, DAC 212 will use the value stored in SAR_L 213B. Note that the number of SAR registers shall be extended if more LNA stages are employed in real implementation. To explain the operation principle, a simpler two-stage LNA is described. During this phase, only DAC 212 and SAR_H/SAR_L registers 213 are turned on for the static compensator 210.

The SAR_H 213A and SAR_L 213B values used in the compensation phase are determined in the calibration phase. During the calibration phase, a successive approximation DC offset search procedure is performed. A binary-tree search scheme using the DAC 212 outputs is performed to quickly determine an estimate of the Type-I DC offset for cancellation at the mixer output. In the meantime, the servo loop feedback of the baseband amplifier remains disabled with the gain of all Variable Gain Amplifiers (3-stage VGA's illustrated: VGA1 221, VGA2 222, and VGA3 223. Similar to LNA, the number of VGA stages can vary in real implementation of different applications.) fixed at their maximum MAX_VGA. While the search procedure begins, the comparator COMP 215 checks the signal polarity of BBI 206. BBI is the output of a DCR RF receiver. It is connected to the input of the ADC (I-ADC) of the baseband processor. This BBI signal is used as an error signal for DC offset calibration. The maximum gain, typically at 75 dB, of all baseband VGA's is included in the calibration loop. This maximum VGA gain is used to provide ample gain to the Type-I DC offset including fixed DC offset due to the VGA's. With >70 dB gain in the estimation path, the DC offset in the comparator 215 itself can therefore be neglected. In other words, there is no need to include an auto-balancing circuit for the comparator COMP 215. The comparator's output is fed to the decision circuit SAR_CNTL 214. SAR_CNTL 214 keeps updating the content of registers SAR_H/SAR_L 213 with its latest decision. The updated registers SAR_H/SAR_L 213 provides better compensation value $V_{OFT1}$. With a better compensation value, the absolute value of BBI becomes smaller. After a few iterations, the compensation $V_{OFT1}$, based on the content of registers SAR_H/SAR_L, gradually converges to an estimate for the Type-I DC offset while the value of BBI gradually converges. The number of iterations required in this calibration process is determined by the bit number SARBIT to represent the SAR.

Several prior arts have employed a similar approach in DC offset reduction design. Said prior art solutions, however, require high bit resolution to implement the compensator DAC. The present invention, however, includes a servo-loop feedback amplifier. This new structure, as further explained below, makes the high bit resolution requirement for the compensation $V_{OFT1}$ unnecessary. This is best illustrated by the practical example as follows.

Example 1

For a total baseband gain of 75 dB, the remaining DC offset at the mixer output after compensation must be smaller than 3.2 µV if the residual DC offset affecting at the baseband ADC input is less than 18 mV (~18 mV*$10^{-75/20}$). 18 mV can be derived assuming a −20 dB DC suppression for an 802.11b received signal and a 500 mV peak-to-peak ADC nominal input range. Assuming that the compensator needs to work on a DC offset ranging from −70 mV to 70 mV, the compensation DAC will require 15 bits (~140 mV/3.2 µV>$2^{15}$).

Such a high resolution compensator DAC is essentially impractical to implement for the following reasons.

First of all, a high resolution DAC takes a lot of chip area and consumes a lot of power. This design is therefore unattractive for any portable device that employs a WLAN solution. Secondly, one needs to add a sophisticated filter into the decision loop to calibrate the high resolution DAC. This filter is used to average out noise in order to correctly extract the DC information that is small compared to noise. In addition, this calibration filter is narrowband and requires a much longer calibration process. Therefore, such a scheme prevents a system from re-calibrating the static DC compensation during a shorter silence period between two adjacent receiving states easily. The present invention requires compensation resolution of only 5-8 bits, which makes this invention very compatible for use in portable devices.

Figure 5:
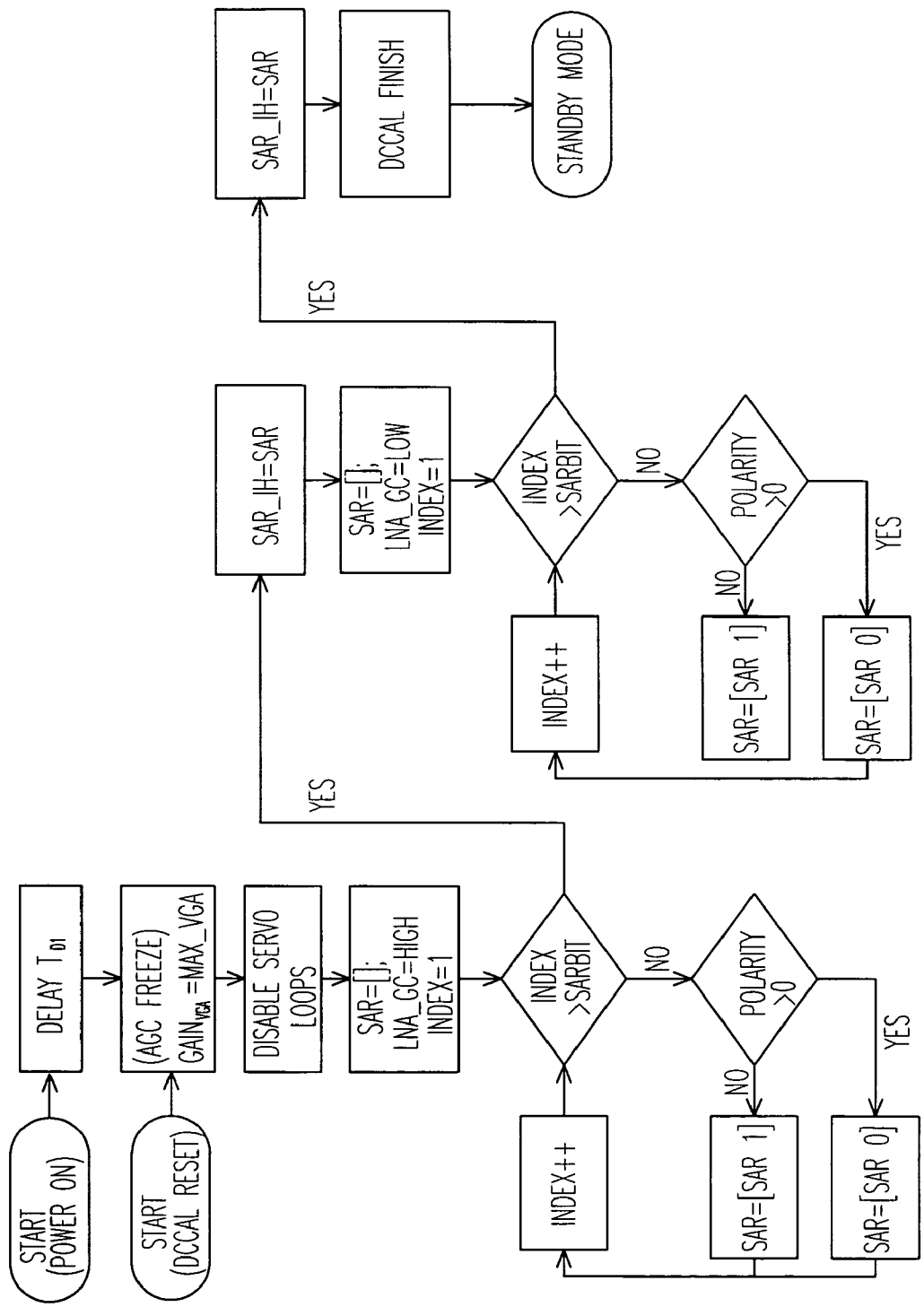
FIG. 5 is a schematic diagram illustrating the flow chart of calibration according to the present invention.

FIG. 5 provides a detailed illustration of the compensator calibration. As shown in the flow chart, the calibration process will be executed when system powers on (POWER ON) or when media access control (MAC) layer requests a re-calibration (DCCAL RESET). A quick re-calibration can be performed at any time during the receipt, transmission, or power down modes as long as system find out a short period in which no normal packet to be transmitted and received. The calibration procedures for these two scenarios are almost the same except for a reserved delay $T_{D1}$. $T_{D1}$ is dedicated to the calibration starting from power-on state. It is required for all circuitry, involved in producing Type-I DC offset, to get ready before the DC offset calibration begins. Therefore, $T_{D1}$ needs to be long enough to allow all receiver blocks to settle after power on. Specifically, to accurately calibrate this kind of DC offset error, the calibration process cannot start until the DC offset error is settled down. Remember that a major part of the static DC offset (Table 1) is due to the impairments related to the LO. Hence, for the LO to function properly, the synthesizer and voltage-control oscillator (VCO) blocks, which generate LO drive, need to converge. A typical synthesizer has a settling time requirement (after power-on) on the order of a couple of hundreds of micro-seconds (µs). This is much longer than any other blocks in the receiver chain. Therefore, $T_{D1}$ is mainly dependent on the settling time requirement of the synthesizer.

During calibration, the automatic gain feedback (AGC) function is frozen with the baseband amplifier's gain $GAIN_{VGA}$ set to maximal, MAX_AGC, and the servo loops are disabled by forcing feedback $V_{OFT2}$ and $V_{OFT3}$ with zero-voltage output. The calibration is performed for two modes: LNA gain high and LNA gain low. First, the SAR register is reset and the LNA gain is asserted high with LNA_GS presented to logic "HIGH". An internal counter INDEX is used to count the number of iterations of the successive approximation search. INDEX is initiated to one before starting the search. For each iteration during the successive approximation, the content of a bit in the register SAR gets updated, from MSB to LSB, based on the logic output of the polarity comparator. When the polarity comparator shows that DC offset is under-compensated, the corresponding bit in the SAR register will be updated with the logic "one" to provide a positive compensation. On the other hand, when the offset is over-compensated, the corresponding bit in ht SAR register will be updated with the logic "zero" to provide a negative compensation. The amount of compensation for each bit is one half of its previous bit, from MSB to LSB. The calibration continues for SARBIT number of iterations after every bit in the SAR register gets a chance to be updated, when the counter INDEX accumulated is larger than the designated bit number SARTBIT. The final content of the SAR is stored into SAR_H. "H" indicates that the stored compensation corresponds to the LNA 205 in high-gain state. The above calibration procedure is repeated with the LNA_GS asserted low. The final SAR value is stored in SAR_L for the LNA 205 in low-gain mode. The calibration is now completed and the receiver is now in standby mode ready to receive signals.

According to an embodiment of the present invention, the DC offset reduction scheme can include an amplifier circuitry with a servo feedback loop. The amplifier cores include VGA stages for automatic gain control (AGC) function of the baseband. To implement an AGC with a dynamic range required for WLAN applications, two to three such VGA stages are typically used. For each of these gain stages, DC offset cancellation is realized by using a narrow-band low-pass filter to extract an estimated DC error component at the gain stage output, and subtracting these estimated DC errors, $V_{OFT2}$ and $V_{OFT3}$, from the inputs of the gain stages locally. This is known as closed-loop feedback servo-mechanism. Referring to FIG. 4, the first servo loop is configured with a subtractor SUB2, a low-pass filter LPF1, and the first sub-VGA stage VGA1; the second loop is configured with a subtractor SUB3, a low-pass filter LPF2, and the second and the third sub-VGA stages VGA2 and VGA3.

With the above scheme, any DC impairment propagated to the output of a VGA amplifier is being sensed and canceled instantly. The servo loop thus provides the amplifier stage a real-time capability to mitigate the unwanted DC components so generated and/or amplified within this amplifier stage. The residual part of Type-I DC offset that was not completely cancelled through the previous static compensator gets cancelled here. Furthermore, the servo-loop feedback amplifier in this invention can also help alleviate the Type-II (dynamic) DC offsets of Table 1.

This embodiment according to the present invention is more advantageous than conventional dynamic DC offset reduction methods. For example, a conventional solution to ease the effects of the problem by means of differential circuits with low on-chip cross-talk and with a very high second-order intercept point (IP2) has been proposed. However, such circuits are mostly useful for the dynamic DC offset generated in the circuit blocks with fixed gain, down conversion mixer MIX, channel-select low-pass filter CS_LPF, and constant gain stage GC. For variable gain stages, the AGC-induced dynamic DC offset is still mostly problematic. This is due to the fact that DC offset of a variable gain stage is a function of gain setting. When the gain is dynamically updated during the AGC settling period, DC offset will varies as well. For a WLAN application like IEEE 802.11b, the allocated time for AGC (and DC offset cancellation) is around 10-20 us. Evolving to high-speed 802.11ag standards, the demanded AGC convergence times are further reduced to 2.4~3.2 us range to minimize undesired packet overhead. In addition, resultant DC fluctuation is too fast for the conventional servo-loop to track. An instant DC offset change still affects the AGC gain decision. This implies that the AGC loop and the DC offset servo loop can interact and cause the system to become unstable.

The AGC loop includes the gain control logic that receives an amplified input signal, estimates the input signal power, and then computes a gain adjust signal in an attempt to keep the input signal power at a predetermined target level for the ADC circuitry. Typically, the AGC updates its gain adjustment signal based on the magnitude of input signal calculated according to the following equation.

$$(BBI^2+BBQ^2)^{0.5}, \text{where } BBI=BBI_{SIG}+BBI_{DC}, \text{and } BBQ=BBQ_{SIG}+BBQ_{DC}$$

It is apparent that the signal power feeding to the level estimation of the AGC control block includes the AC signal (SIG) and the residual DC offset (DC) for both the in-phase and quadrature components. If the residual DC offset component is significant compared to signal power, the gain-depending DC components can bias the AGC function in estimating the signal power level. As a result, it is very likely that the AGC function can be misled and its convergence can be impacted. In the worst case, such a system can become unstable.

To maintain both the gain feedback and DC cancellation working properly in terms of accuracy and speed, an innovative scheme with hand-shaking mechanism is proposed in one embodiment of the present invention. The hand-shaking block is an auxiliary interface between the AGC and DC offset cancellation circuits. Its function is to ensure proper operation of both AGC and DC offset cancellation functions. Conceptually, the hand-shaking block uses a stop-and-go algorithm. It stops the AGC gain feedback function as soon as it senses that the residual DC component is larger than a predetermined level. With the AGC gain frozen, the DC offset function will continue to operate until the DC component is suppressed to a smaller level by the DC reduction circuitry. This is to ensure that the AGC gain decision function will not be misled by extraneous DC errors. The stop-and-go cycles can minimize the possible mutual interactions between AGC and DC offset cancellation and therefore the AGC is still working well in the presence of large DC disturbance.

High-speed DC cancellation is required for WLAN applications to fulfill the crucial timing delay budget. The time spent during the DC reduction is still at a bottleneck. Hence, none of the recently proposed schemes are suited for practical implementation.

Conventionally, an AGC control circuit will distribute its gain equally to all its VGA stages. In FIG. 4, a GAIN MAPPING BLOCK 227 in an embodiment according to the present invention is presented to provide improved DC,offset cancellation effect. This GAIN MAPPING BLOCK 227 generates three outputs $G_1$, $G_2$, and $G_3$ in regard to a gain adjustment signal $G_{VGA}$ requested from the baseband AGC control block. These three outputs are used to control the gain-state of the three sub-VGA stages, VGA1, VGA2, and VGA3, respectively. The GAIN MAPPING BLOCK 227 functions as a gain distributor. The VGA's gain $G_{VGA}$ issued by the AGC control clock is realized by the three sub-VGA stages in cascade. The gain of each sub-VGA stage is not equal and is determined by the mapping clock individually.

Figure 6A:
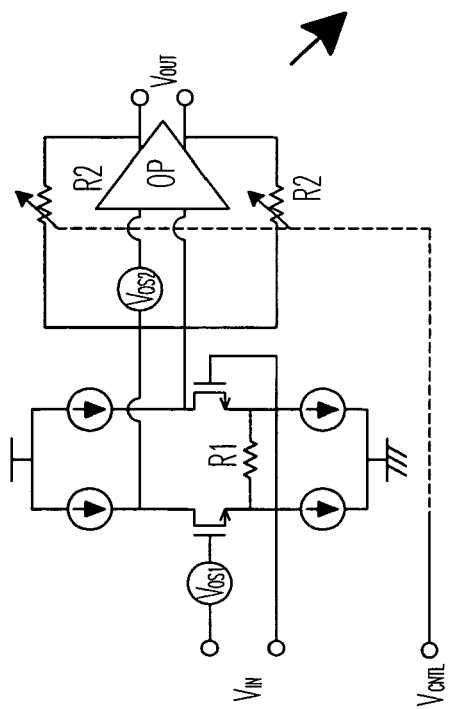
FIG. 6A, FIG. 6B, and FIG. 6C are schematic diagrams depicting the DC offset model of a base band amplifier according to the present invention.
Figure 6B:
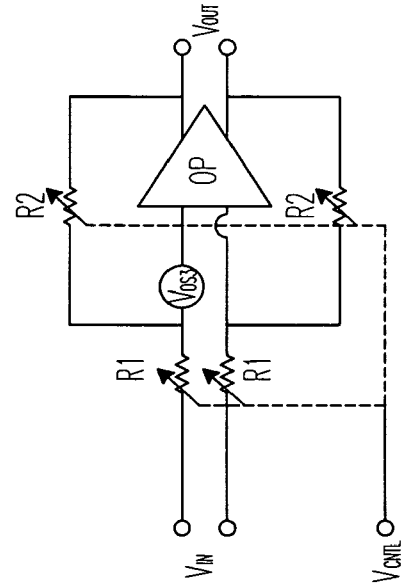
Figure 6C:
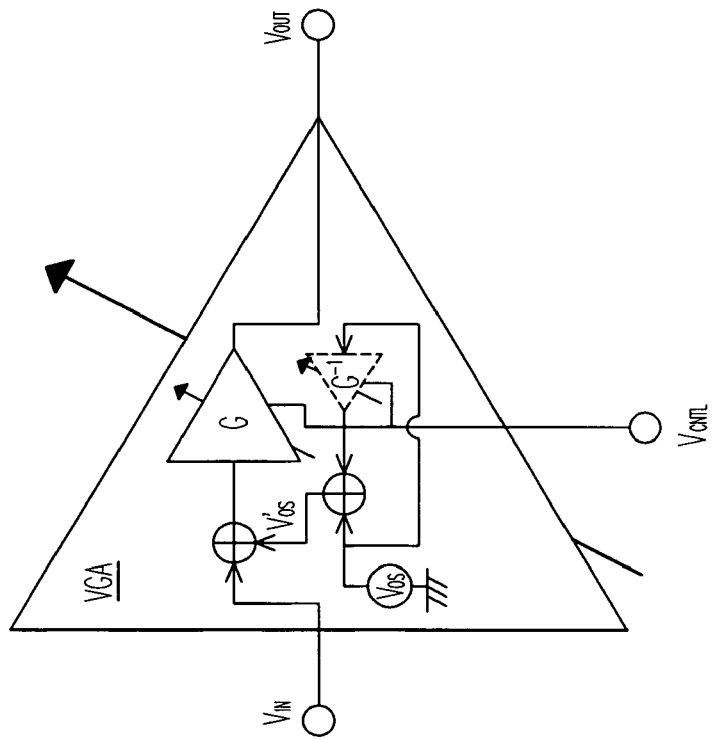

To explain the operations of the GAIN MAPPING BLOCK 227, schematics of commonly used VGA amplifiers are shown in FIG. 6a and FIG. 6b. Analysis will be based on the model in FIG. 6c. The amplifiers are required to offer accurate gain and to be wide-band and high-speed. To maintain accurate gain, the variable gain G is controlled by the resistance ratio of R2 to R1. The component matching keeps the amplifier from process and temperature variations. As shown in FIG. 6c, an amplifier is expressed by an offset-free gain stage G in conjunction with an equivalent DC offset $V_{OS'}$, referred at the amplifier input. The input referred offset is determined as $$V_{OS'}=V_{OS}(1+1/G), \qquad \text{Eq. 1}$$

where $V_{OS}$ represents the intrinsic offset voltage due to amplifier OP, associated trans-conductance stage, or compound involved in the gain stage implemented. It is apparent that part of the equivalent input offset is a function of the gain G determined. This means that the DC offset follows an AGC gain update. This offset model can be easily extended to a general form for an amplifier that is composed of a number of sub-stages. For a three-stage VGA as shown in FIG. 4, the overall DC offset, when referred to the very front of the first stage input, can be expressed as:

$$V_{OS'}=V_{OS1}+(V_{OS1}+V_{VOS2})*1/G_1+(V_{VOS2}+V_{VOS3})*1/(G_1G_2)+V_{VOS3}/(G_1G_2G_3) \qquad \text{Eq. 2}$$

Equation 2 reveals the non-linear dependency of DC offset on AGC gain settings in a practical AGC implementation. $V_{Osi}$ and $G_i$ are the intrinsic offset and gain of the $i^{th}$ stage. The overall gain of all the VGA's, $G_{VGA}$, is equal to $G_1G_2G_3$.

Computer simulation has been conducted to demonstrate the advantages of the gain mapping scheme according to an embodiment of the present invention. Referring to the circuit in FIG. 4, the simulation is executed in regards to the following steps, first with uniform gain assignment and then with variable gain assignment in the gain-mapping block 227.

Step 1: Assign $V_{MIX, DC}$. $V_{MIX, DC}$ represents the equivalent DC component referred to the conversion mixer output. It is generated using a uniform distribution ranging from −50 mV to 50 mV.

Step 2: Assign intrinsic offsets ($V_{OS1}$, $V_{OS2}$, and $V_{OS3}$) for the three sub-VGA stages. The offset values are generated by a uniform distribution function between −15 mV to 15 mV.

Step 3: Disable servo-loop feedbacks with $V_{OFT2}=V_{OFT3}=0$.

Step 4: Freeze AGC function with $V_{VGA}$=MAX_VGA (67 dB) and

Step 5: Calibrate $V_{OFT1}$ for the static compensation.

Step 6: Enable servo-loops to search for proper feedbacks of $V_{OFT2}$ and $V_{OFT3}$.

Step 7: Maintain the feedbacks of $V_{OFT2}$ and $V_{OFT3}$ searched and disable servo-loops.

Step 8: Record the residual DC offset at ADC input.

Step 9: Mark down the residual DC offsets at the ADC input while the VGA gain $V_{VGA}$ is manually swept from 66 dB to 0 dB in −1 dB steps. The gain for each gain stage is equal to $G_1=G_2=G_3=\frac{1}{3}G_{VGA}$.

According to the simulation, we are able to check the residual offset profile for difference gain stages. Note that the three feedbacks are obtained in regard to the maximal gain situation MAX_VGA. Remember the AGC will be asserted to its maximum gain to provide the maximum receiver sensitivity.

Figure 7:
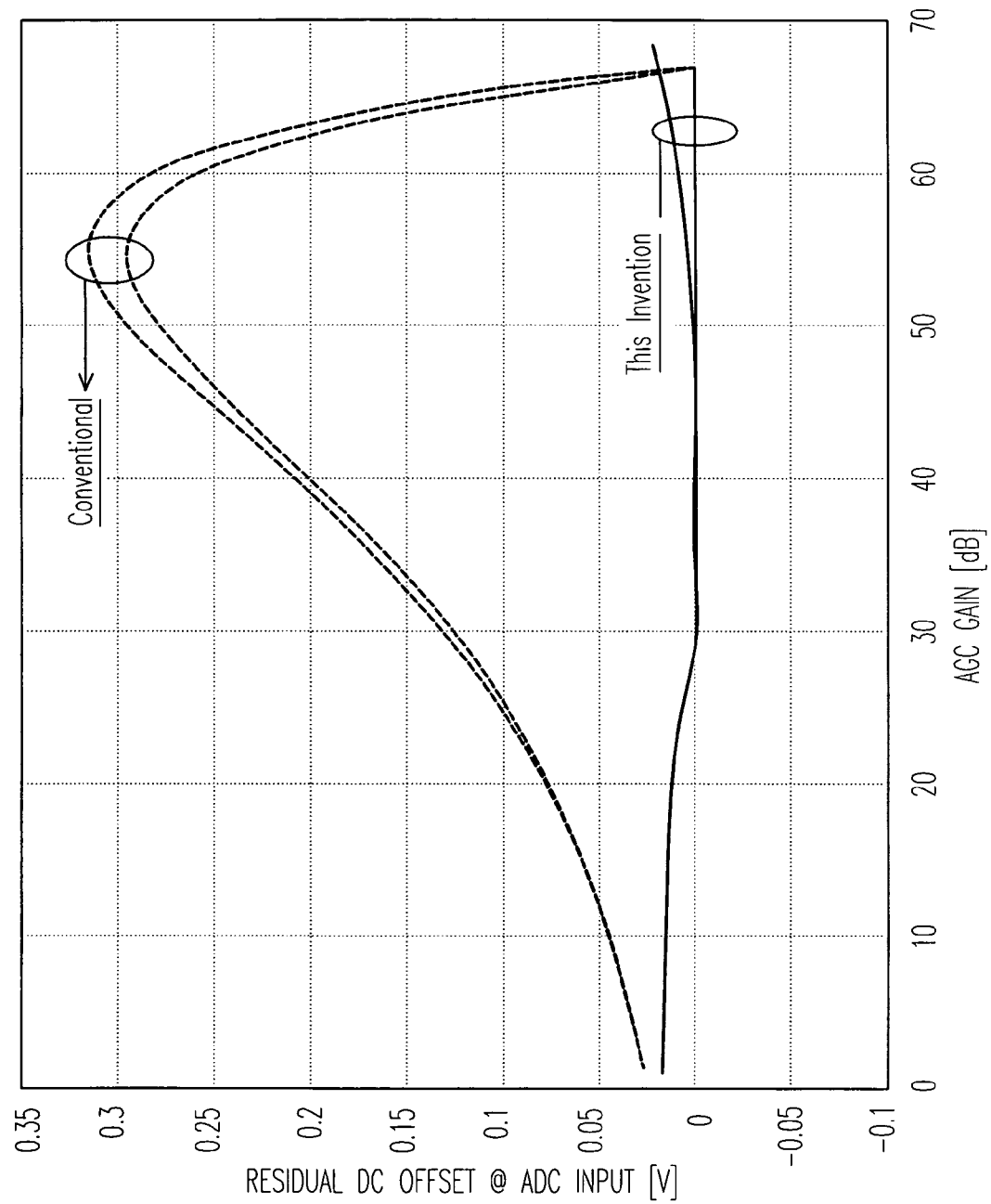
FIG. 7 is a comparison of the residual DC offset between the conventional AGC gain assignment and the gain arrangement according to the present invention.

FIG. 7 shows the results when the above 8 steps are re-executed 1000 times with respect to different assignment of offset values ($V_{MIX, DC}$, $V_{OS1}$, $V_{OS2}$, and $V_{OS3}$). Two dashed lines illustrate the maximal the minimal residual DC offsets at the ADC input for the 1000 simulations.

It can be seen in FIG. 7 that, with uniform gain assignment, the residual DC offsets at the ADC input can still vary substantially as a function of the overall VGA gain. With static compensations based on a maximal gain of 67 dB, the residual DC offset is significant. As shown, the maximal offset is 300 mV even though the offset at calibration phase (with maximal gain) is reduced to below 18 mV. In short, the DC offset compensation value obtained using the maximum AGC gain of $G_{VGA}$=67 dB does not provide efficient DC offset cancellation for the overall AGC gain ranges of 0 to 67 dB.

In order to relieve this problem, the present invention introduces a gain-mapping block, 227, into the control path between the AGC control block 209 and the baseband amplifier stages. When receiving an ordinary VGA control signal $G_{VGA}$, GAIN MAPPER creates three individual outputs, namely $G_1$, $G_2$, and $G_3$, to adjust the sub-VGA stages VGA$_1$, VGA$_2$, and VGA$_3$, respectively. The gain mapping algorithm is described as follows:

If $G_{VGA}<G_{max, 1}$, $G_1=G_{VGA}, G_2=0, G_3=0;$ else if $G_{VGA}<G_{max, 1}+G_{max, 2}$, $G_1=G_{max,1}, G_2=G_{VGA}-G_{max,1}, G_3=0;$ else $G_1=G_{max,1}, G_2=G_{max,2}, G_3=G_{VGA}-G_{max,1}-G_{max,2}; \qquad \text{Eq. 3}$ end.

Where $G_{max, i}$ denotes the maximal available gain at the $i^{th}$ sub-stage. Instead of assigning an average gain $G_i$ to all individual stage, $G_i=G_{VGA}/3$, for i=1, 2, and 3 (the conventional approach as shown above), the principle of the proposed gain mapping is to assign as much gain at the front stages as possible, for a given $G_{VGA}$. The motivation is clear with equation 2 rewritten as:

$$V_{OS'}=V_{OS1}(1+1/G_1)+1/G_1*[V_{OS2}(1+1/G_2)+1/(G_1G_2)*[V_{OS3}(1+1/G_3)] \qquad \text{Eq. 4}$$

Equation 4 reveals that the input referred offset changing $\Delta V_{OS}$, caused by each individual sub-VGA stage, for example $G_1$, $G_2$, and $G_3$, is different. For a fixed amount of gain transition ΔG occurring at each stage, the resultant input referred offset change due to the front stage receives a larger gain than a later stage. Applying the algorithm in Eq. 3, the gain mapping block keeps the gain transition as further away from a front stage as possible. Consequently, the DC offset fluctuation between two consecutive gain steps is minimized.

The effect can be illustrated redoing the simulation with modification of Step 9 as follows:

Step 9': Mark down the residual DC offsets at the ADC input while the VGA gain $V_{VGA}$ is manually swept from 66 dB to 0 dB in −1 dB steps. The gain for each gain stage is determined by Eq. 3. $G_{max, 1}$, $G_{max, 2}$, and $G_{max, 3}$ are 30 dB, 30 dB, and 7 dB, respectively.

The results are depicted between two solid lines in FIG. 7. Compared to the equal-gain distribution, the DC offset fluctuation is reduced dramatically. The residual ADC input DC offset is maintained below 18 mV over the entire AGC gain range. Substantial over- or under-compensation using the conventional approach is now avoided. In other words, the calibration results ($V_{OFT1}$, $V_{OFT2}$, and $V_{OFT3}$) obtained using the maximum AGC gain works for all other AGC gain condition. The new gain distribution algorithm provides a great advantage. The complicated hand-shaking interface between AGC and DC reduction can be eliminated when the gain mapping block is adapted.

Figure 8:
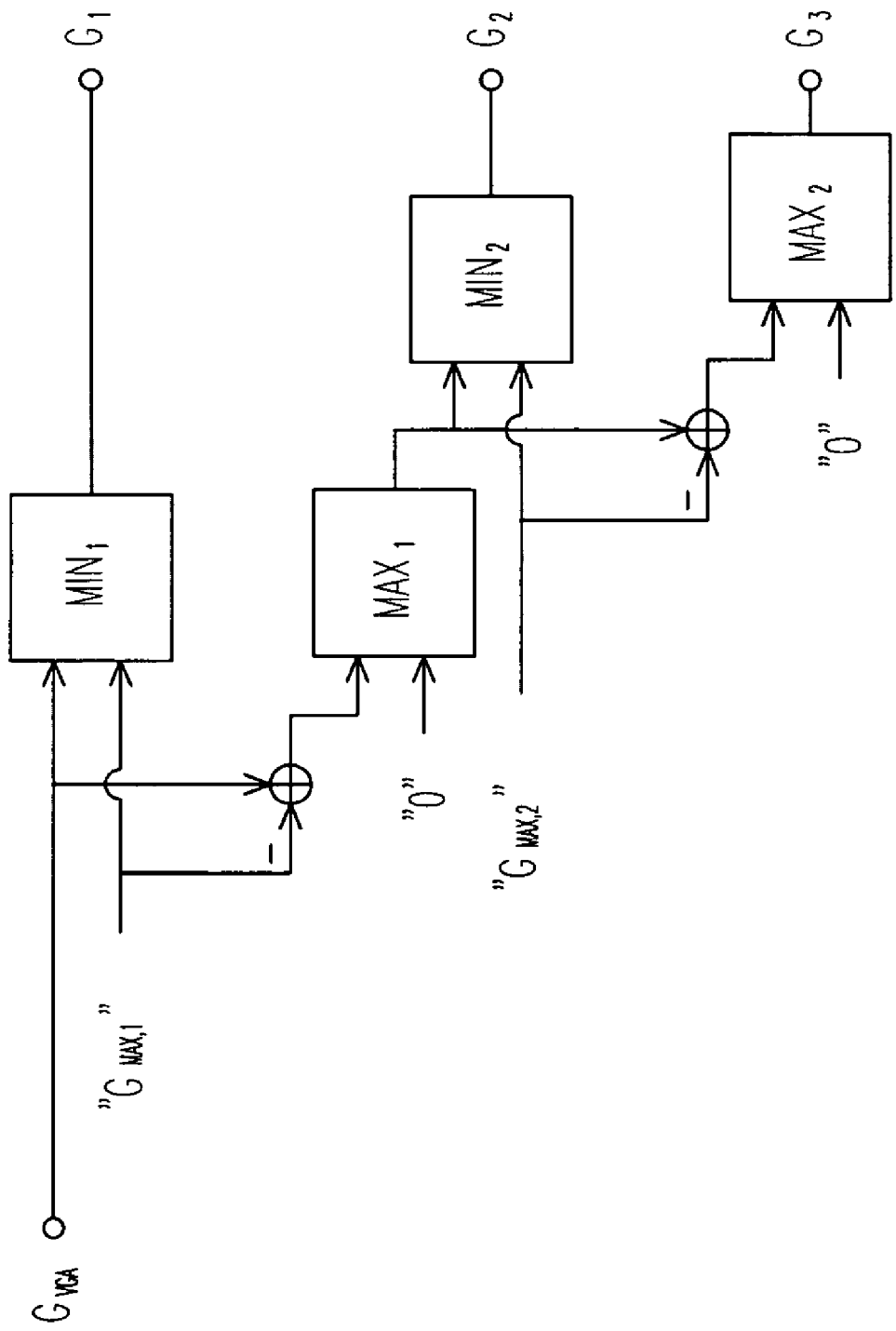
FIG. 8 is a schematic diagram of the gain mapping block according to the present invention.

Compared to the hand-shaking interface, the new gain mapping block is much simpler to implement. A conceptual diagram of the gain mapping block is shown in FIG. 8. After receiving an overall gain control $G_{VGA}$ from the AGC function, the mapper implements the first gain control $G_1$ by Eq. 1 a logic block $MAX_1$ to find the minimum between two inputs: $G_{VGA}$ and $G_{MAX1}$. Similarly, the second gain control $G_2$ is generated by a block $MAX_1$ followed by a block $MIN_2$ each with two inputs. The $MAX_2$ block first finds the maximum of the two inputs: $G_{VGA}-G_{max,1}$ and 0. The $MIN_2$ block then find $G_2$ as the minimum of the two inputs: output of the $MAX_1$ block and $G_{MAX1}$. Finally, the third gain control $G_3$ is generated by a block $MAX_2$ with two inputs: $G_{VGA}-G_{max,1}-G_{max,2}$ and 0.

Figure 9:
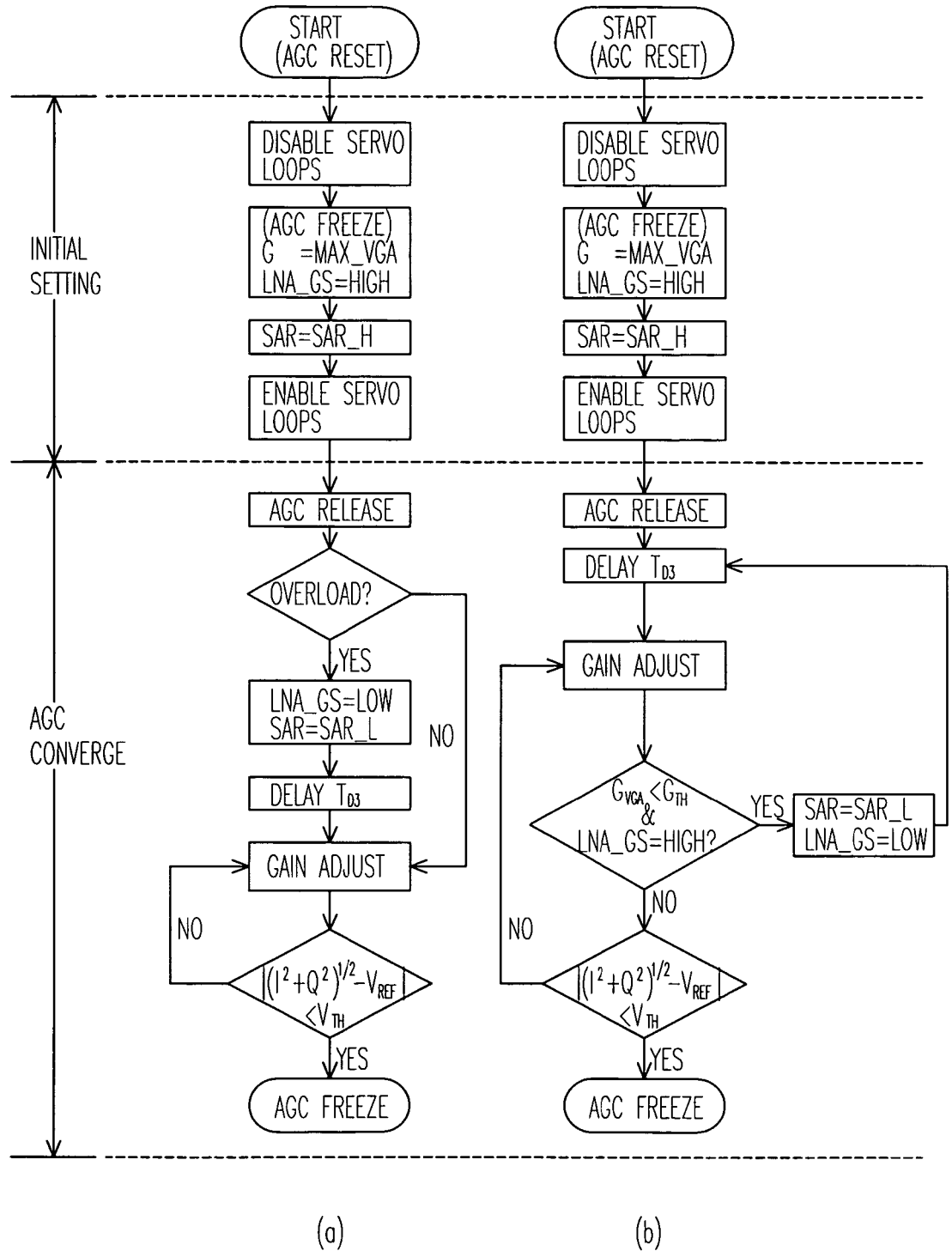
FIG. 9(a) and FIG. 9(b) are flow charts illustrating the normal operation of the receiver in the present invention with, 9(a), and without, 9(b), overload detection.

FIG. 9 provides detailed descriptions for DC offset and gain control functions according to embodiments of the present invention. As shown in the flowchart, both AGC and DC offset reduction are triggered by an AGC reset signal, AGC RESET. The AGC RESET asserts when the system changes from transmit state to receive state, or whenever the AGC is unlocked due to a large energy change in medium.

Right after the AGC is reset, the servo-feedback loops for DC reduction are disabled and the AGC is frozen. At this moment, the VGA gain is set to maximum, $VGA_{MAX}$, and the LNA is switched to high gain mode. The static compensator generates static compensation depending on register SAR_H. After the above initialization, the servo-loops are activated. This period is called initial setting. It generates proper compensations $V_{OFT1}$, $V_{OFT2}$, and $V_{OFT3}$ before the AGC starts to converge in order to minimize impact of the DC offset in the VGA amplifiers described above.

Regarding the optimal LNA gain settling, two approaches can be employed depending on if overload detection OVLD_DET 250 is available (FIG. 4). An overload detector is typically inserted after the channel select low-pass filter CS_LPF. This detector is an auxiliary block to measure the down-converted signal power within the channel bandwidth of interest. Once the detected power is greater than a predetermined threshold, the front end circuitry can become overloaded by a large receiver signal. Once an overload condition is detected, the LNA can be switched to a low gain mode. In the presence of a strong received signal, an LNA of low gain mode can prevent the RF front end circuitry, such as the down-converter, from operating in a non-linear region and hence extend the dynamic range of a receiver. However, when an auxiliary overload detector is not implemented, the AGC control block will need to determine a proper LNA mode. The LNA's gain can be simply switched off when the adopted AGC gain is lower than a predetermined threshold $G_{TH}$ (see FIG. 9(B)). FIGS. 9A and 9B are illustrated flowcharts that show both cases and are further discussed below.

FIG. 9A illustrates the AGC with the assistance of overload detection. The first step during the AGC convergence period is to check the overload status. The overload detection gets rid of DC offset, since the static compensator has removed the majority of the static Type-I DC component presented at mixer output. If an overload occurs, the LNA gain will be switched to LOW and the static compensator output will correspond to SAR_L. Before stepping into normal gain adjustment, a delay time $T_{D3}$ is recommended. This delay allows the new compensations $V_{OFT1}$, and $V_{OFT2}$ and $V_{OFT3}$ in the servo-loops to settle for the new (low) LNA gain state. The AGC gain control loop can now dynamically adjust the baseband gain without much impact from DC offset. The AGC update will be frozen until the adjusted baseband level, $(BBI^2+BBQ^2)^{0.5}$ is closed to a reference level, $V_{REF}$, with an error smaller than a predetermined threshold of $V_{TH}$.

A similar flowchart without an auxiliary overload detector is depicted in FIG. 9B. Right before beginning of AGC convergence period, an extra delay time $T_{D3}$ is again used for servo-loop adjustment to mitigate residual DC offsets right before AGC gain adjustment begins. The delay time has the same order of magnitude as the overload detector response time. This time interval allows the servo-loop to converge with the feedback corrections $V_{OFT2}$ and $V_{OFT3}$ ready before normal AGC gain adjustment. To deal with the gain selection of the LNA, one more decision is needed during the normal AGC gain adjustment loop. If the requested VGA gain $G_{VGA}$ is smaller than a threshold $G_{TH}$ and the LNA is in high gain mode, the LNA will be switched to a low-gain mode and the stored value in register SAR_L will be used to control the static compensator output. Note that the threshold $G_{TH}$ is chosen as a trade off of the system's linearity and noise figure. The AGC gain adjustment will continue after another postponement of $T_{D3}$ during which the AGC gain will be frozen at its maximum for servo-loops to converge.

When compared to a stop-and-go algorithm, the DC reduction scheme according to the present invention reduces significantly the time required for the AGC loops to converge.

Figure 10:
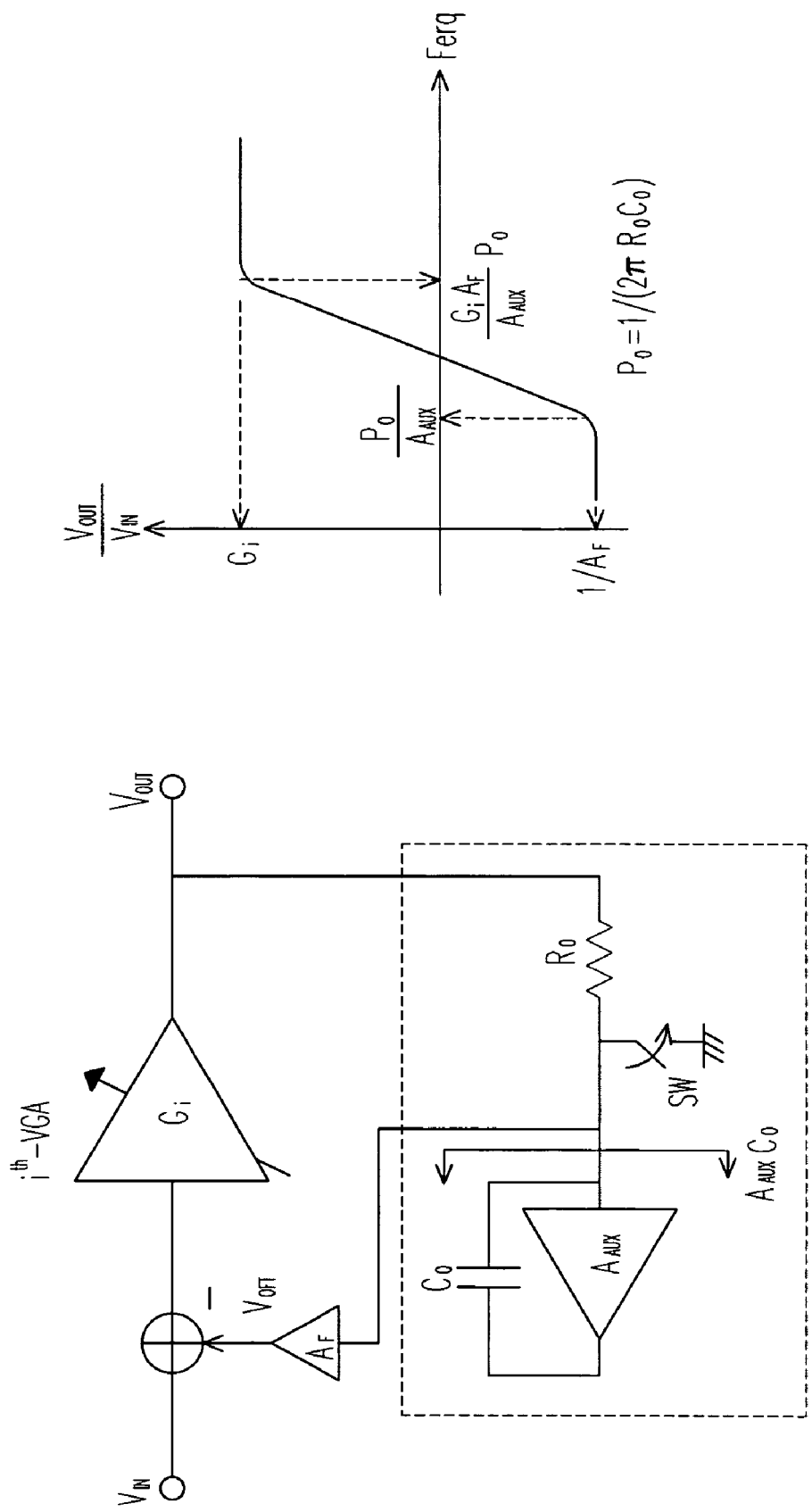
FIG. 10 illustrates the Miller capacitance implementation for low high-pass frequency corner according to the present invention.

In an actual circuit implementation, Miller effect is utilized in the servo-loop design as shown in FIG. 10. This design provides two advantages. First, the pole on the servo feedback path can be reduced by a factor of $A_{AUX}$. Based on the derivation, the high-pass corner determined by the servo loop is given by:

$$f_{HPC}=2\pi * A_{MAIN} * A_F * P_O/A_{AUX}, \text{where } P_O=1/(R_O * C_O).$$

where $A_{MAIN}$ AND $A_F$ are the main and the feedback amplifier's gains.

For a practical design which demands the corner frequency on the order of tens of kilohertz (e.g. 40 KHz), the resultant time constant, $1/P_O$, is too large to be totally implemented on-chip. External capacitors and extra pins are required in a conventional implementation. With the Miller effect, the equivalent capacitance is amplified and therefore no more external components are needed.

Figure 11:
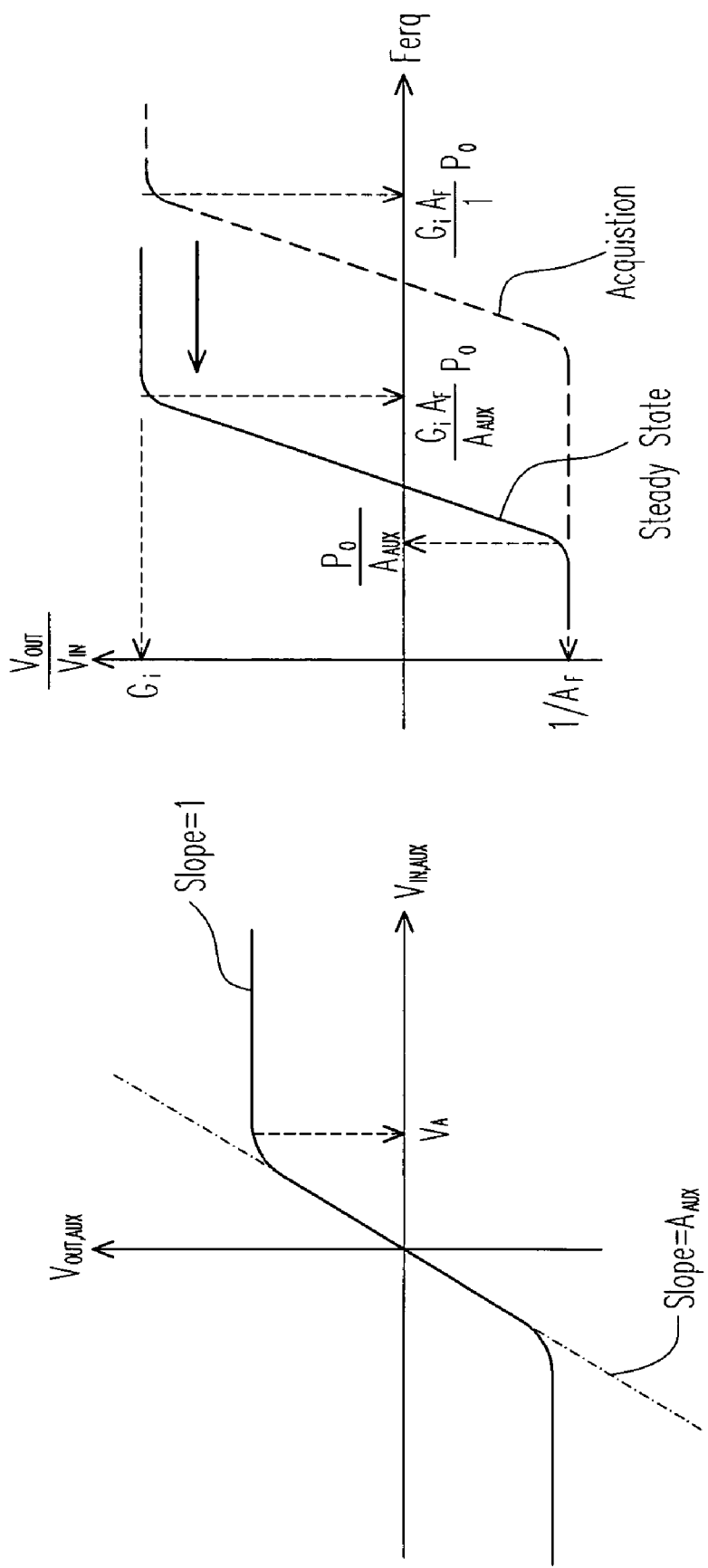
FIG. 11 illustrates a fast initial acquisition due to Miller capacitance according to the present invention.

The other advantage of utilizing Miller capacitance is its inherent bandwidth extension characteristics. Referring to FIG. 11, the auxiliary gain stage provides a gain of $A_{AUX}$ only when the input signal (DC offset) is within $V_A$. That is, when the DC offset of the servo-loop is not compensated initially; the DC offset is large and the auxiliary amplifier $A_{AUX}$ is saturated and is driven into non-linear state with instant small-signal gain ~1. During this moment, the low frequency characteristic of the servo-loop is dominated by the pole of $P_O$ rather than by $P_O/A_{AUX}$. The instant high-frequency corner benefits the servo feedback loop with a faster DC settling manner.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. An RF receiver circuit for reducing static and dynamic offsets, comprising:
   a low noise amplifier (LNA);
   a plurality of down conversion mixers;
   a plurality of static compensators coupled to the down conversion mixers;
   a plurality of constant gain stages coupled to the static compensators;
   a plurality of channel-select low-pass filters connected to the constant gain stages;
   a plurality of servo-loop feedback amplifiers connected to the channel-select low pass filters, wherein each of the servo-loop feedback amplifiers comprises a plurality of subtractors, a plurality of variable gain amplifiers, and a plurality of low pass filters, wherein one of the low pass filters is coupled between an output of one of the variable gain amplifiers and a minuend end of one and the plurality of servo-loop feedback amplifiers includes three amplifiers connected in a three-stage configuration, the first amplifier having a maximum gain of $G_{max,1}$, the second amplifier having a maximum gain of $G_{max,2}$, and the third amplifier having a maximum gain of $G_{max,3}$, and wherein a gain mapping block allocates gain $G_1$ to the first amplifier, gain $G_2$ to the second amplifier, and gain $G_3$ to the third amplifier such that a total target gain for the three-stage amplifier G is distributed according to the following conditions:
   if $G<=G_{max,1}$, then setting $G_1=G$, $G_2=0$, and $G_3=0$;
   if $G>G_{max,1}$ and $G<=(G_{max,1}\ G_{max,2})$, then setting $G_1=G_{max,1}$ and $G_2=G-G_{max,1}$, and $G_3=0$; and
   if $G>(G_{max,1}+G_{max,2})$ and $G=(G_{max,1}+G_{max,2}+G_{max,3})$, then setting $G_1=G_{max,1}$, $G_2=G_{max,2}$, $G_3=G-(G_{max,1}+G_{max,2})$
   wherein the gain mapping block is driving the servo-loop feedback amplifiers, and the gain mapping block assigns the gain for each stage in the servo-loop feedback amplifiers in such a way as to use a maximum gain of an earlier stage before assigning an unsatisfied gain to the remaining stages;
   a plurality of analog to digital converters; and
   an automatic gain feedback control block driving the LNA and the gain mapping block.

2. The RF receiver circuit of claim 1, wherein the down conversion mixers comprises of an in-phase mixer and a quadrature-phase mixer.

3. The RF receiver circuit of claim 1, wherein the analog to digital converters (ADC) comprises of a quadrature-phase ADC and an in-phase ADC.

4. The RF receiver circuit of claim 1, wherein the static compensators comprises of an in-phase static compensator and a quadrature-phase static compensator.

5. The RF receiver circuit of claim 1, wherein the servo-loop feedback amplifiers comprises of an in-phase servo-loop feedback amplifier and a quadrature-phase servo-loop feedback amplifier both driven to the gain mapping block.

6. The RF receiver circuit of claim 1, wherein each of the static compensators comprises of:
   a subtractor;
   a digital to analog converter (DAC);
   a first register;
   a second register;
   a controller; and
   a comparator.

7. The RF receiver circuit of claim 1, further comprising an overload detection circuit having an input and an output, the input connected from the channel-select low pass filters and the output connected to the automatic gain feedback control block.

8. The RF receiver circuit of claim 1, wherein Miller capacitance is utilized in the servo-loop feedback amplifiers.

9. The RF receiver circuit of claim 6, wherein the digital to analog converter (DAC) has a capacity of 5-8 bits.

10. A method for amplifier gain allocation to reduce DC offset in an N-stage servo-feedback variable gain amplifier by using a gain mapping block, wherein a target total gain for the N-stage amplifier is G, a maximum gain in each stage is $G_{max,1}$, $G_{max,2}$, ..., $G_{max,N}$ respectively, and a gain setting to each stage is $G_1$, $G_2$, ..., $G_N$, respectively, the method comprising the following steps:
   if $G<=G_{max,1}$ then the gain mapping block sets $G_1=G$ and $G_i=0$ for i=2, ..., N;
   if $G>G_{max,1}$ and $G<=(G_{max,1}+G_{max,2})$, then the gain mapping block sets $G_1=G_{max,1}$ and $G_2=G-G_{max,1}$, and $G_i=0$ for i=3 ... N;
   if $G>(G_{max,1}+G_{max,2})$ and $G=(G_{max,1}+G_{max,2}+G_{max,3})$, then the gain mapping block sets $G_1=G_{max,1}$, $G_2=G_{max,2}$, $G_3=G-(G_{max,1}+G_{max,2})$, and $G_i=0$ for i=4, ..., N; and
   the gain mapping block continues assigning a maximum remaining gain to the first available stage until a desired target total gain G is satisfied.

11. The method for amplifier gain allocation as recited in claim 10, wherein N=3, and wherein the target total gain for the 3-stage amplifier is G, the maximum gain in each stage is $G_{max,1}$, $G_{max,2}$, $G_{max,3}$, respectively, and the gain setting to each stage is $G_1$, $G_2$, $G_3$, respectively, the method comprising the following steps:
   if $G<=G_{max,1}$, then the gain mapping block sets $G_1=G$, $G_2=0$, and $G_3=0$;
   if $G>G_{max,1}$ and $G<=(G_{max,1}+G_{max,2})$, then the gain mapping block sets $G_1=G_{max,1}$ and $G_2=G-G_{max,1}$, and $G_3=0$; and
   if $G>(G_{max,1}+G_{max,2})$ and $G<=(G_{max,1}+G_{max,2}+G_{max,3})$, then the gain mapping block sets $G_1=G_{max,1}$, $G_2=G_{max,2}$, $G_3=G-(G_{max,1}+G_{max,2})$.

12. A method for DC offset reduction for an RF receiver including a low-noise amplifier (LNA), an automatic gain control (AGC) circuit, servo-loops for dynamic DC offset reduction, and a static DC offset reduction circuit, the method comprising:
   resetting the AGC;
   disabling the servo-loops;
   setting initial gains for variable gain amplifiers in the servo-loops and the LNA;
   enabling the servo-loops;
   releasing the AGC;
   setting a delay time to allow the servo-loops to settle their gain settings;
   adjusting gains of LNA; and
   freezing the AGC;
   wherein the variable gain amplifiers includes three amplifiers connected in a three-stage configuration, the first amplifier having a maximum gain of $G_{max,1}$, the second amplifier having a maximum gain of $G_{max,2}$, and the third amplifier having a maximum gain of $G_{max,3}$, and wherein gain $G_1$ is allocated to the first amplifier, gain $G_2$ is allocated to the second amplifier, and gain $G_3$ is allocated to the third amplifier such that a total target gain for the three-stage amplifier G is distributed according to the following conditions:

if $G<=G_{max,1}$, then setting $G_1=G$, $G_2=0$, and $G_3=0$;

if $G>G_{max,1}$ and $G<=(G_{max,1}+G_{max,2})$, then setting $G_1=G_{max,1}$ and $G_2=G-G_{max,1}$, and $G_3=0$; and if $G>(G_{max,1}+G_{max,2})$ and $G<=(G_{max,1}+G_{max,2}+G_{max,3})$, then setting $G_1=G_{max,1}$, $G_2=G_{max,2}$, $G_3=G-(G_{max,1}+G_{max,2})$.

13. A method as recited in claim 12, wherein the delay time is about 100 to 200 ns.

* * * * *